United States Patent
Heeres et al.

(10) Patent No.: US 10,540,602 B2
(45) Date of Patent: Jan. 21, 2020

(54) TECHNIQUES OF OSCILLATOR CONTROL FOR QUANTUM INFORMATION PROCESSING AND RELATED SYSTEMS AND METHODS

(71) Applicant: Yale University, New Haven, CT (US)

(72) Inventors: Reinier Heeres, New Haven, CT (US);
Brian Vlastakis, New Haven, CT (US);
Victor V. Albert, New Haven, CT (US); Stefan Krastanov, New Haven, CT (US); Liang Jiang, Guilford, CT (US); Robert J. Schoelkopf, III, Madison, CT (US)

(73) Assignee: Yale University, New Haven, CT (US)

( * ) Notice: Subject to any disclaimer, the term of this patent is extended or adjusted under 35 U.S.C. 154(b) by 323 days.

(21) Appl. No.: 15/552,998

(22) PCT Filed: Feb. 26, 2016

(86) PCT No.: PCT/US2016/019769
§ 371 (c)(1),
(2) Date: Aug. 23, 2017

(87) PCT Pub. No.: WO2016/138378
PCT Pub. Date: Sep. 1, 2016

(65) Prior Publication Data
US 2018/0247217 A1 Aug. 30, 2018
US 2019/0347574 A9 Nov. 14, 2019

Related U.S. Application Data

(60) Provisional application No. 62/126,130, filed on Feb. 27, 2015.

(51) Int. Cl.
*H03B 5/18* (2006.01)
*H03B 9/14* (2006.01)
(Continued)

(52) U.S. Cl.
CPC ........... *G06N 10/00* (2019.01); *H03B 5/1847* (2013.01); *H03K 19/195* (2013.01)

(58) Field of Classification Search
CPC ..... G06N 10/00; H03B 5/1847; H03K 19/195
(Continued)

(56) References Cited

U.S. PATENT DOCUMENTS 6,578,018 B1 6/2003 Ulyanov
6,635,898 B2 10/2003 Williams et al.
(Continued)

FOREIGN PATENT DOCUMENTS

EP 2 797 038 A2 10/2014
WO WO 2008/140290 A2 11/2008
(Continued)

OTHER PUBLICATIONS

International Search Report and Written Opinion for International Application No. PCT/US2016/019769 dated May 5, 2016.
(Continued)

*Primary Examiner* — Richard Tan
(74) *Attorney, Agent, or Firm* — Wolf, Greenfield & Sacks, P.C.

(57) ABSTRACT

According to some aspects, a method is provided of operating a circuit quantum electrodynamics system that includes a physical qubit dispersively coupled to a quantum mechanical oscillator, the method comprising applying a first electromagnetic pulse to the physical qubit based on a number state of the quantum mechanical oscillator, wherein the first electromagnetic pulse causes a change in state of the quantum mechanical oscillator, and applying, subsequent to application of the first electromagnetic pulse, a second electromagnetic pulse to the quantum mechanical oscillator that coherently adds or removes energy from the quantum mechanical oscillator.

26 Claims, 9 Drawing Sheets

(51) Int. Cl.
*H01L 23/66* (2006.01)
*G06N 10/00* (2019.01)
*H03K 19/195* (2006.01)

(58) Field of Classification Search
USPC .................................................. 331/107 SL
See application file for complete search history.

(56) References Cited

U.S. PATENT DOCUMENTS

| | | | |
|---|---|---|---|
| 6,943,368 | B2 | 9/2005 | Amin et al. |
| 7,230,266 | B2 | 6/2007 | Hilton et al. |
| 7,498,832 | B2 | 3/2009 | Baumgardner et al. |
| 7,899,092 | B2 | 3/2011 | Malinovsky |
| 8,106,717 | B2 | 1/2012 | Ichimura et al. |
| 8,138,784 | B2 | 3/2012 | Przybysz et al. |
| 8,242,799 | B2 | 8/2012 | Pesetski et al. |
| 8,508,280 | B2 | 8/2013 | Naaman et al. |
| 8,514,478 | B1 | 8/2013 | Spence |
| 2002/0188578 | A1 | 12/2002 | Amin et al. |
| 2004/0109631 | A1 | 6/2004 | Franson et al. |
| 2004/0119061 | A1 | 6/2004 | Wu et al. |
| 2004/0200949 | A1 | 10/2004 | Beausoleil et al. |
| 2006/0017992 | A1 | 1/2006 | Beausoleil, Jr. et al. |
| 2006/0056631 | A1 | 3/2006 | Beausoleil et al. |
| 2009/0033369 | A1 | 2/2009 | Baumgardner et al. |
| 2012/0002968 | A1 | 1/2012 | Luo et al. |
| 2012/0319085 | A1 | 12/2012 | Gambetta et al. |
| 2012/0319684 | A1 | 12/2012 | Gambetta et al. |
| 2013/0196855 | A1 | 8/2013 | Poletto et al. |
| 2013/0308956 | A1 | 11/2013 | Meyers et al. |
| 2014/0266406 | A1 | 9/2014 | Abraham et al. |
| 2014/0314419 | A1 | 10/2014 | Paik |
| 2016/0233965 | A1 | 8/2016 | Medford |
| 2016/0308502 | A1 | 10/2016 | Abdo et al. |
| 2016/0364653 | A1 | 12/2016 | Chow et al. |
| 2017/0193388 | A1 | 7/2017 | Filipp et al. |
| 2017/0201224 | A1 | 7/2017 | Strong et al. |
| 2018/0032895 | A1 | 2/2018 | Jiang et al. |
| 2019/0087743 | A1 | 3/2019 | Heeres et al. |

FOREIGN PATENT DOCUMENTS

| | | |
|---|---|---|
| WO | WO 2017/151200 | 9/2014 |
| WO | WO 2016/138378 A1 | 9/2016 |
| WO | WO 2016/138399 A1 | 9/2016 |
| WO | WO 2018/089850 A1 | 5/2018 |

OTHER PUBLICATIONS

International Preliminary Report on Patentability for International Application No. PCT/US2016/019769 dated Sep. 8, 2017.
International Search Report and Written Opinion for International Application No. PCT/US2016/019807 dated May 2, 2016.
International Preliminary Report on Patentability for International Application No. PCT/US2016/019807 dated Sep. 8, 2017.
International Search Report and Written Opinion for Application No. PCT/US2016/43514 dated May 23, 2017.
International Preliminary Report on Patentability for Application No. PCT/US2016/043514 dated Feb. 8, 2018.
Invitation to Pay Additional Fees for International Application No. PCT/US2017/061181 dated Dec. 22, 2017.
International Search Report and Written Opinion for International Application No. PCT/US2017/061181 dated Feb. 23, 2018.
Wendin et al., Superconducting quantum circuits, qubits and computing. Aug. 30, 2005. http://qudev.phys.ethz.ch/content/courses/QSIT08/pdfs/WendinReview.pdf, 60 pages.
Zueco et al., Qubit-oscillator dynamics in the dispersive regime: analytical theory beyond rotating wave approximation. Physical Review A. Jul. 20, 2009;80.3;1-6.
Extended European Search Report for European Application No. 16756458.2 dated Nov. 12, 2018.
Extended European Search Report for European Application No. 16855886.4, dated Feb. 22, 2019.
Aharonov et al., Phase Change During a Cyclic Quantum Evolution, Phys. Rev. Lett. Apr. 20, 1987; 58(16):1593-6.
Albert et al., Symmetries and conserved quantities in Lindblad master equations. Phys. Rev. A. Feb. 21, 2014;89(2):022118-1-14.
Andersson et al., Binary search trees for generalized measurements. Phys. Rev. A. May 6, 2008;77(5):052104-1-5.
Barreiro et al., An Open-System Quantum Simulator with Trapped Ions. Nature. Feb. 24, 2011;470:486-91.
Beige et al., Quantum Computing Using Dissipation to Remain in a Decoherence-Free Subspace. Phys Rev. Lett. Aug. 21, 2000; 85(8):1762-5.
Bianchetti et al., Dynamics of dispersive single qubit read-out in circuit quantum electrodynamics. Phys. Rev. A. Oct. 30, 2009;80(4):043840-1-7.
Blais et al., Cavity quantum electrodynamics for superconducting electrical circuits:An architecture for quantum computation. Phys. Rev. A. Jun. 29, 2004;69(6):062320-1-14.
Brattke et al., Generation of Photon Number States on Demand via Cavity Quantum Electrodynamics Phys. Rev. Lett. Apr. 16, 2001;86(16):3534-7.
Braunstein et al., Quantum information with continuous variables. Rev. Mod. Phys. Apr. 2005;77, 513-77.
Burgath et al., Non-Abelian phases from quantum Zeno dynamics. Phys. Rev. A. Oct. 9, 2013;88(4), 042107-1-5.
Cacheffo et al., Quasi-perfect state transfer in a bosonic dissipative network. J. Phys. B:At. Mol. Opt. Phys. May 5, 2010;43(10):105503.
Cafaro et al., Quantum stabilizer codes embedding qubits into qudits. Phys. Rev. A. Aug. 2012;86(2):022308.
Carollo et al., Coherent quantum evolution via reservoir driven holonomy. Phys. Rev. Lett. Jan. 20, 2006;96(2):020403-1-4.
Carollo et al., Geometric phase induced by a cyclically evolving squeezed vacuum reservoir. Phys. Rev. Lett. Apr. 21, 2006;96(15):150403-1-4.
Chaturvedi et al., Berry's phase for coherent states. J. Phys. A:Math. Gen. Nov. 11, 1987;20(16):L1071-5.
Choi, Completely positive linear maps on complex matrices. Linear Algebra and Its Applications. Jun. 1, 1975;10(3):285-90.
Dasgupta et al., Decoherence-induced geometric phase in a multi-level atomic system. J. Phys. B:At. Mol. Opt. Phys. May 14, 2007;40(9):S127.
De Oliveira et al., Properties of displaced number states. Phys. Rev. A. Mar. 1, 1990;41(5):2645-52.
De Ponte et al., Relaxation- and decoherence-free subspaces in networks of weakly and strongly coupled resonators. Ann. Phys. Sep. 2007;322(9):2077-84.
De Ponte et al., Storing quantum states in bosonic dissipative networks. J. Phys. B:At. Mol. Opt. Phys. Nov. 14, 2008;41(21):215506.
De Ponte et al., State protection under collective damping and diffusion. Phys. Rev. A. Jul. 26, 2011;84(1):012331-1-5.
Deléglise et al., Reconstruction of non-classical cavity field states with snapshots of their decoherence. Nature. Sep. 25, 2008;455(7212):510-4.
Devoret et al., Superconducting Circuits for Quantum Information: An Outlook. Science. Mar. 8, 2013;339(6124):1169-74.
Divincenzo, Quantum Computation. Science. Oct. 13, 1995;270(5234):255-61.
Dodonov et al., Even and Odd Coherent States and Excitations of a Singular Oscillator. Physica. Mar. 15, 1974;72(3):597-615.
Duan et al., Preserving coherence in quantum computation by pairing the quantum bits. Phys. Rev. Lett. Sep. 8, 1997;79(10):1953-6.
Facchi et al., Quantum Zeno Subspaces. Physical Review Letters. Aug. 19, 2002;89(8):080401-1-4.
Feng et al., Geometric Entangling Gates in Decoherence-Free Subspaces with Minimal Requirements. Phys. Rev Lett. Nov. 13, 2009:103(20):200501-1-4.
Fouquieres et al., Second order gradient ascent pulse engeineering. J. Mag. Res. Oct. 2011;212(2):412-7.
Gambetta et al., Qubit-photon intereactions in a cavity:Measurement-induced dephasing and number splitting. Phys. Rev. A. Oct. 17, 2006;74(4):042318-1-14.

(56) References Cited

OTHER PUBLICATIONS

Gorini et al., Completely dynamical semigroups of N-level systems. J. Math. Phys. May 1976;17(5):821-5.

Gottesman et al., Encoding a qubit in an oscillator. Phys. Rev. A. Jul. 2001;64(1):012310-1-21.

Heeres et al., Cavity State Manipulation Using Photon-Number Selective Phase Gates. Phys Rev Lett Sep. 25, 2015;115(13):137002-1-5. arXiv:1503.01496v1.

Hofheinz et al., Generation of Fock states in a superconducting quantum circuit. Nature. Jul. 17, 2008;454(7202):310-4.

Hofheinz et al., Synthesizing arbitrary quantum states in a superconducting resonator. Nature. May 28, 2009;459(7246):546-9.

Houck et al., Generating single microwave photons in a circuit. Nature. Sep. 20, 2007;449(7160):328-31.

Johnson et al., Quantum non-demolition detection of single microwave photons in a circuit. Nature Phys. Jun. 20, 2010;6:663-7.

Kapit, Error-Transparent Quantum Gates for Small Logical Qubit Architectures. Physical Review Letters. Feb. 1, 2018;120(5):050503-1-5.

Kempe et al., Theory of decoherence-free fault-tolerant universal quantum computation. Phys. Rev. A. Apr. 2001;63(4):042307-1-29.

Knill et al., Theory of Quantum Error Correction for General Noise. Phys. Rev, Lett. Mar. 13, 2000;84(11):2525-8.

Krastanov et al., Universal Control of an Oscillator with Dispersive Coupling to a Qubit. Phys. Rev. A. Oct. 21, 2015;92(4):040303-1-5.

Lanyon et al., Universal Digital Quantum Simulation with Trapped Ions. Science. Oct. 7, 2011;334(6052):57-61.

Law et al., Arbitrary Control of a Quantum Electromagnetic Field. Phys. Rev. Lett. Feb. 12, 1996;76(7):1055-8.

Leek et al., Observation of Berry's Phase in a Solid-State Qubit. Science. Dec. 21, 2007;318(5858):1889-92.

Leghtas et al., Confining the state of light to a quantum manifold by engineered two-photon loss. Science. Feb. 20, 2015;347(6224):853-7.

Leghtas et al., Deterministic protocol for mapping a qubit to coherent state superpositions in a cavity. Phys. Rev. A. Apr. 15, 2013;87(4):042315-1-7.

Leghtas et al., Hardware-Efficient Autonomous Quantum Memory Protection. Phys Rev Lett. Sep. 20, 2013;111(12):120501-1-5.

Leibfried et al., Quantum dynamics of single trapped ions. Rev. Mod. Phys. Jan. 2003;75(1):281-324.

Liang et al., Nonadiabatic holonomic quantum computation in decoherence-free subspaces with trapped ions. Phys. Rev. A. Jun. 10, 2014;89(6):062312-1-5.

Lidar et al., Decoherence Free Subspaces for Quantum Computation. Phys. Rev. Lett. Sep. 21, 1998;81(12):2594-7.

Lindblad, On the Generators of Quantum Dynamical Semigroups. Commun. Math. Phys. Jun. 1976;48(2):119-30.

Lloyd et al., Quantum Computation over Continuous Variables. Phys. Rev. Lett. Feb. 22, 1999;82(8):1784-7.

Michael et al., New Class of Quantum Error-Correcting Codes for Bosonic Mode, Phys. Rev. X. Jul.-Sep. 2016:6(3):031006-1-26.

Mirrahimi et al., Dynamically protected cat-qubits:a new paradigm for universal quantum computation. New Journal of Physics. Apr. 2014;16(4):045014. doi:10.1088/1367-2630/16/4/045014. 30 pages.

Mischuck et al., Qudit quantum computation in the Jaynes-Cumming model. Phys. Rev. A. Feb. 2013;87(2):022341-1-14.

Mousolou et al., Universal non-adiabatic holonomic gates in quantum dots and single-molecule magnets. New J. Phys. Jan. 17, 2014;16:013029.

Neto et al., From decoherence-free channels to decoherence-free and quasi-free subspaces within bosonic dissipative networks. J. Phys. B:At. Mol. Opt. Phys. Jul. 5, 2011;44(14):145502.

Nigg et al., Quantum computations on a topolgically encoded qubit. Science. Jul. 18, 2014;345(6194):302-5.

Ofek et al., Extending the lifetime of a quantum bit with error correction in superconducting circuits. Nature. Aug. 2016;536(7617):441.

Oreshkov et al., Adiabatic Markovian Dynamics Phys. Rev. Lett. Jul. 30, 2010;105(5):050503.

Oreshkov et al., Fault-Tolerant Holonomic Quantum Computation. Phys. Rev. Lett. Feb. 20, 2009;102(7):070502-1-4.

Osaki et al., Derivation and physical interpretation of the optimum detection operators for coherent-state signals. Phys. Rev. A. Aug. 1996;54(2):1691-1701.

Pachos et al., Decoherence-free dynamical and geometrical entangling phase gates. Phys. Rev. A Mar. 26, 2004;69(3):033817-1-9.

Palomaki et al., Coherent state transfer between itinerant microwave fields and a mechanical oscillator. Nature. Mar. 14, 2013. 495(7440):210-4.

Paz-Silva et al., Zeno effect for quantum computation and control. Physical Review Letters. Feb. 24, 2012;108(8):080501-1-5.

Poyatos et al., Quantum Reservoir Engineering with Laser Cooled Trapped Ions. Phys. Rev. Lett. Dec. 2, 1996;77(23):4728-31.

Reagor et al., Reaching 10 ms single photon lifetimes for superconducting aluminum cavities. Appl. Phys. Lett. May 13, 2013:102(19):192604.

Recati et al., Holonomic quantum computation with neutral atoms. Physical Review A. Sep. 17, 2002;66(3):032309-1-13. doi:10.1103/PHYSREVA.66.032309. 14 pages.

Reiserer et al., A quantum gate between a flying optical photon and a single trapped atom. Nature. Apr. 10, 2014;508(7495):237-40.

Rosenblum et al., Fault-tolerant measurement of a quantum error syndrome. Science. Jul. 20, 2018;361(6399):266-70.

Salathe et al., Digital Quantum Simulation of Spin Models with Circuit Quantum Electrodynamics. Phys. Rev. X 5. Apr.-Jun. 2015;5(2):021027-1-12.

Sarandy et al., Abelian and non-Abelian geometric phases in adiabatic open quantum systems. Phys. Rev. A. Jun. 5, 2006;73(6):062101-1-10.

Schindler et al., Quantum simulation of open-system dynamical maps with trapped ions. Nat. Phys. May 19, 2013;9:361-7.

Schoelkopf et al., Wiring up quantum systems. Nature. Feb. 7, 2008;451(7179):664-9.

Shankar et al., Autonomously stabilized entanglement between two superconducting quantum bits. Nature. Dec. 19, 2013;504(7480):419-22.

Shen et al., Quantum channel construction with circuit quantum electrodynamics Phys Rev B. Apr. 1, 2017;95(13):134501-1-14. arXiv:1611.03463.

Signoles et al., Confined quantum Zeno dynamics of a watched atomic arrow. Nature Phys. Oct. 2014;10:715-9.

Sjöqvist, A new phase in quantum computation. Physics. Nov. 17, 2008;1:35.

Smolin et al., Efficient Method for Computing the Maximum-Likelihood Quantum State from Measurements with Additive Gaussian Noise. Phys. Rev. Lett. Feb. 17, 2002;108(7):070502-1-4.

Tiecke et al., Nanophotonic quantum phase switch with a single atom. Nature. Apr. 10, 2014;508(7495):241-4.

Vlastakis et al., Deterministically Encoding Quantum Information Using 100-Photon Schrodinger Cat States. Science. Nov. 1, 2013;342(6158):607-10.

Vourdas, Quantum systems with finite Hilbert space. Rep. Prog. Phys. Mar. 2004:67(3):267-320.

Wallraff et al., Strong coupling of a single photon to a superconducting qubit using circuit quantum electrodynamics. Nature. Sep. 9, 2004;431(7005):162-7.

Whitney et al., Automated generation of layout and control for quantum circuits. CF '07 Proceedings of the 4th International Conference on Computing Frontiers. May 7-9, 2007:83-94.

Wilczek et al., Appearance of Gauge Structure in Simple Dynamical Systems. Phys. Rev. Lett. Jun. 10, 1984;52(24):2111-4.

Wu et al., Holonomic Quantum Computation in Decoherence-Free Subspaces. Phys. Rev. Lett. Sep. 25, 2005;95(13):130501-1-4.

Wu et al., Time-dependent Decoherence-Free Subspace. J. Phys. A:Math. Theor. Oct. 12, 2012;45(40):405305-1-7.

Xu et al., Non-Adiabatic Holonomic Quantum Computation in Decoherence-Free Subspaces. Phys. Rev, Lett. Oct. 26, 2015;109(17):170501-1-5.

Xu et al., Universal Nonadiabatic Geometric Gates in Two-Qubit Decoherence-Free Subspaces. Sci. Rep. Oct. 29, 2014;4:6814.

(56) References Cited

OTHER PUBLICATIONS

Yin et al., Implementation of holonomic quantum computation through engineering and a manipulating environment. Physical Review A. Dec. 18, 2007;76(6):062311-1-5. doi:10.1103/Physreva.76.0062311.

Zanardi et al., Coherent quantum dynamics in steady-state manifolds of strongly dissipative systems. Phys. Rev. Lett. Dec. 12, 2014;113(24):240406-1-5.

Zanardi et al., Geometry, robustness, and emerging unitarity in dissipation-projected dynamics Phys. Rev. A. May 26, 2015;91(5):052324-1-8.

Zanardi et al., Holonomic Quantum Computation. Phys. Lett. A. Dec. 20, 1999;264(2-3), 94-9.

Zanardi et al., Noiseless Quantum Codes. Phys. Rev. Lett. Oct. 27, 1997;79(17):3306-9.

Zanardi, Stablizing Quantum Information. Phys. Rev. A. Jan. 2001;63(1):012301-1-4.

Zanardi, Virtual Quatum Subsystems. Phys. Rev. Lett. Aug. 13, 2001;87(7):077901-1-4.

Zhang et al., Physical implementation of holonomic quantum computation in decoherence-free subspaces with trapped ions. Phys. Rev. A. Sep. 13, 2006;74(3):034302-1-4.

Zhang et al., Quantum computation in noiseless subsystems with fast non-Abelian holonomies. Phys. Rev. A. Apr. 2014;89(4):042302-1-6.

Zheng, Dissipation-induced geometric phase for an atom trapped in an optical vacity. Phys. Rev. A. May 10, 2012;85(5):052106-1-5.

Zheng, Open-system geometric phase based on system-reservoir joint state evolution. Phys. Rev. A. Jun. 27, 2014;89(6):062118-1-6.

Zhu et al., Geometric quantum gates robust against stochastic control errors. Phys. Rev. A. Aug. 15, 2005;72(2):020301-1-4.

Extended European Search Report dated Oct. 5, 2018 in connection with European Application No. 16756442.6.

Kirchmair et al., Observation of quantum state collapse and revival due to the single-photon Kerr effect. Nature. Mar. 14, 2013; 495 (7440): 205-09.

Schuster et al., Resolving photon number states in a superconducting circuit. Nature Letters. Feb. 1, 2007; 445: 515.

International Search Report and Written Opinion for International Application No. PCT/US2019/012440, dated Jul. 29, 2019.

International Preliminary Report on Patentability for International Application No. PCT/US2017/061181 dated May 23, 2019.

TECHNIQUES OF OSCILLATOR CONTROL FOR QUANTUM INFORMATION PROCESSING AND RELATED SYSTEMS AND METHODS

CROSS-REFERENCE TO RELATED APPLICATIONS

This application is a national phase filing under 35 U.S.C. § 371 of International Application No. PCT/US2016/019769, filed on Feb. 26, 2016, which claims priority to U.S. Provisional Patent Application No. 62/126,130, filed on Feb. 27, 2015, each of which are incorporated herein by reference to the maximum extent allowable.

STATEMENT REGARDING FEDERALLY-SPONSORED RESEARCH AND DEVELOPMENT

This invention was made with U.S. Government support under Grant No. W911NF-14-1-0011 awarded by the U.S. Army Research Office. The U.S. Government may have certain rights in this invention.

FIELD

The present application is directed to devices and methods for controlling the state of a quantum mechanical system.

BACKGROUND

The ability to prepare and control the quantum state of a quantum system is important for quantum information processing. Just as a classical computer memory should have the ability to initialize bits and implement gates to change the state of a bit from zero to one and vice versa, a quantum computer should be able to initialize the state of the quantum system used to store quantum information and the quantum system should be able to be controlled to implement logical gates that change the quantum state of the quantum system.

Quantum information may be stored in any of a variety of quantum mechanical systems. Conventionally, quantum information may be stored using quantum bits, referred to as "qubits," which are typically two-state quantum mechanical systems. However, many-state quantum systems, such as quantum mechanical oscillators, may also be used to store quantum information.

SUMMARY

Some aspects are directed to a method of operating a circuit quantum electrodynamics system that includes a physical qubit dispersively coupled to a quantum mechanical oscillator, the method comprising applying a first electromagnetic pulse to the physical qubit based on a number state of the quantum mechanical oscillator, wherein the first electromagnetic pulse causes a change in state of the quantum mechanical oscillator, and applying, subsequent to application of the first electromagnetic pulse, a second electromagnetic pulse to the quantum mechanical oscillator that coherently adds or removes energy from the quantum mechanical oscillator.

According to some embodiments, the method further comprises driving the physical qubit to a ground state prior to application of the first electromagnetic pulse, and driving the physical qubit to the ground state after application of the first electromagnetic pulse.

According to some embodiments, the method further comprises measuring a parity of the quantum mechanical oscillator by applying a third electromagnetic pulse to the physical qubit based on the number state of the quantum mechanical oscillator.

According to some embodiments, the method further comprises measuring the number state of the quantum mechanical oscillator by applying a fourth electromagnetic pulse to the physical qubit.

According to some embodiments, a frequency of the first electromagnetic pulse is based on the number state of the quantum mechanical oscillator.

According to some embodiments, an amplitude of the first electromagnetic pulse is less than a magnitude of a dispersive coupling between the physical qubit and the quantum mechanical oscillator.

According to some embodiments, the change in state of the quantum mechanical oscillator caused by the first electromagnetic pulse is a quantum phase change of one or more Fock state components of the quantum mechanical oscillator.

According to some embodiments, a qubit frequency shift per photon in the quantum mechanical oscillator is larger than a qubit transition line width.

According to some embodiments, the first electromagnetic pulse includes a first frequency component and the quantum mechanical oscillator is resonant at a second frequency, different from the first frequency.

According to some embodiments, a frequency of the second electromagnetic pulse is a resonant frequency of the quantum mechanical oscillator.

According to some embodiments, the second electromagnetic pulse is based at least in part on the first electromagnetic pulse.

According to some embodiments, the physical qubit comprises a Josephson junction.

According to some embodiments, the physical qubit is a superconducting transmon qubit.

According to some embodiments, the quantum mechanical oscillator is a radiation cavity.

According to some embodiments, the quantum mechanical oscillator is a microwave stripline cavity.

According to some embodiments, the first electromagnetic pulse comprises microwave frequencies.

Some aspects are directed to a circuit quantum electrodynamics system, comprising a physical qubit, a quantum mechanical oscillator dispersively coupled to the physical qubit, and at least one electromagnetic radiation source configured to independently apply electromagnetic pulses to the qubit and to the oscillator by applying a first electromagnetic pulse to the physical qubit based on a number state of the quantum mechanical oscillator to cause a change in state of the quantum mechanical oscillator, and applying a second electromagnetic pulse to the quantum mechanical oscillator to coherently add or remove energy from the quantum mechanical oscillator.

According to some embodiments, the quantum mechanical oscillator is a first quantum mechanical oscillator, the system further comprises a second quantum mechanical oscillator coupled to the physical qubit, and a quality factor of the second quantum mechanical oscillator is lower than a quality factor of the first quantum mechanical oscillator.

According to some embodiments, the change in state of the quantum mechanical oscillator caused by the first electromagnetic pulse is a quantum phase change of one or more Fock state components of the quantum mechanical oscillator.

According to some embodiments, a qubit frequency shift per photon in the quantum mechanical oscillator is larger than a qubit transition line width.

According to some embodiments, the first electromagnetic pulse includes a first frequency component and wherein the quantum mechanical oscillator is resonant at a second frequency, different from the first frequency.

According to some embodiments, the physical qubit comprises a Josephson junction.

According to some embodiments, the physical qubit is a superconducting transmon qubit.

According to some embodiments, the quantum mechanical oscillator is a radiation cavity.

According to some embodiments, the quantum mechanical oscillator is a microwave stripline cavity.

According to some embodiments, the first electromagnetic pulse is configured to comprise microwave frequencies.

BRIEF DESCRIPTION OF DRAWINGS

Various aspects and embodiments will be described with reference to the following figures. It should be appreciated that the figures are not necessarily drawn to scale. In the drawings, each identical or nearly identical component that is illustrated in various figures is represented by a like numeral. For purposes of clarity, not every component may be labeled in every drawing.

DETAILED DESCRIPTION

Figure 1:
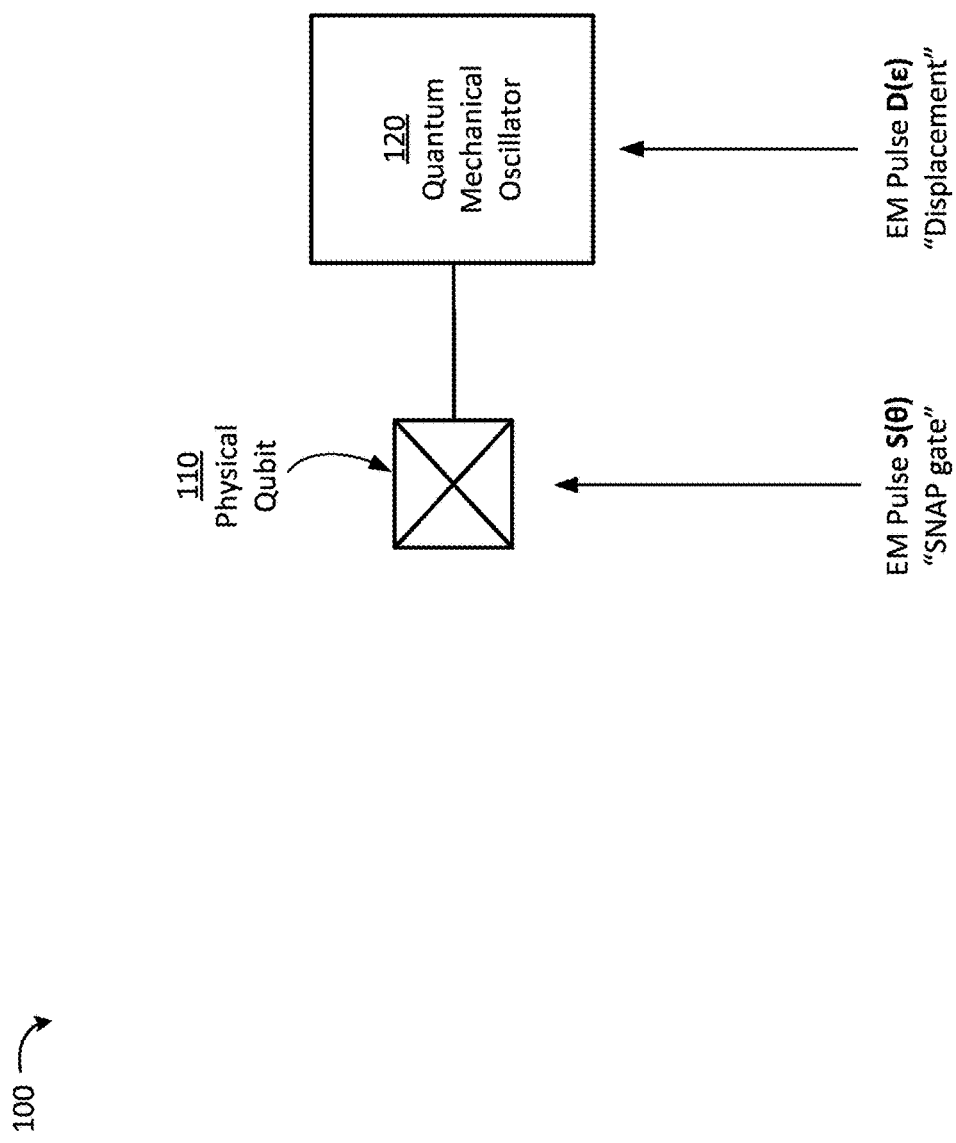
FIG. 1 is a block diagram of a quantum mechanical system, according to some embodiments.

Conventional quantum information processing schemes couple a number of two-level quantum systems (i.e., "qubits") to encode information. However, quantum information tends to be fragile and susceptible to noise and decoherence processes. Thus, error-correction protocols are frequently employed with a goal of prolonging the amount of time for which quantum information may be reliably stored.

Some quantum error-correction protocols utilize a single logical qubit built from a collection of physical qubits. For instance, the quantum state $|\psi\rangle$, of a logical qubit may be represented by a superposition of the two states, $|0\rangle$ and $|1\rangle$, e.g., $|\psi\rangle = \alpha|0\rangle + \beta|1\rangle$, where $\alpha$ and $\beta$ are complex numbers representing the probability amplitude of the logical qubit being in state $|0\rangle$ and $|1\rangle$, respectively. In some error correction schemes, the quantum state of the logical qubit may be encoded physically in a plurality of physical qubits, such as by entangling three physical qubits in a state with the same probability amplitudes as the logical qubit: $|\psi\rangle = \alpha|000\rangle + \beta|111\rangle$, which represents the entangled quantum state of three physical qubits.

Other quantum error-correction schemes utilize a quantum mechanical oscillator to encode a bit of quantum information, since such oscillators tend to exhibit longer decoherence times that qubits built from, say, Josephson junctions. Such oscillators have a linear energy spectrum, however, making quantum control of the oscillator's state difficult due to the resulting degeneracy of state transitions. Conventionally, a qubit may be resonantly coupled to the quantum mechanical oscillator, which produces a combined system that has a controllable nonlinearity.

The inventors have recognized and appreciated that there are advantages to forming a system in which a qubit is far off-resonantly, or dispersively, coupled to a quantum mechanical oscillator. In particular, a dispersive coupling between a physical qubit and a quantum mechanical oscillator may be selected such that universal control (i.e., implementation of arbitrary unitary operations) of the combined qubit-oscillator system can be realized. The physical qubit may be driven with an electromagnetic pulse (e.g., a microwave pulse) which results in change to one or more Fock states of the oscillator dispersively coupled to the qubit. These pulses applied to the physical qubit, referred to herein as Selective Number-Dependent Arbitrary Phase, or "SNAP" gates, may be combined to produce an arbitrary unitary operation upon the oscillator.

According to some embodiments, a SNAP gate applied to the physical qubit may be following by a displacement operator applied to the quantum mechanical oscillator dispersively coupled to the qubit. The SNAP gate, when applied to the qubit, may alter the phase of one or more Fock states of the oscillator. Subsequently, a displacement operator applied to the oscillator may alter the population of one or more Fock states of the oscillator. The combination of these two operations may together allow for arbitrary unitary operations upon the oscillator. According to some embodiments, the qubit may be driven to a ground state before and/or after application of the SNAP gate to reduce the likelihood of a detrimental effect on the quantum state of the oscillator when not being addressed. In some cases, driving the qubit to the ground state after a SNAP gate may be followed by application of a displacement operator.

As discussed above, techniques for universal control described herein utilize a system in which a physical qubit is far off-resonantly, or dispersively, coupled to a quantum mechanical oscillator. According to some embodiments, the coupling between the qubit and oscillator may be such that the qubit frequency shift per photon in the quantum mechanical oscillator is greater than both the qubit and oscillator transition line-widths. The far off-resonantly or dispersive coupling causes the number states of the oscillator $|n\rangle$ to resolve to different frequencies of the qubit. Thus, an electromagnetic pulse having a frequency associated with a particular number state of the oscillator may be applied to the qubit, thereby causing a change (e.g., a phase change) in that number state of the oscillator.

Following below are more detailed descriptions of various concepts related to, and embodiments of, techniques for controlling the state of a quantum mechanical system. It should be appreciated that various aspects described herein may be implemented in any of numerous ways. Examples of specific implementations are provided herein for illustrative purposes only. In addition, the various aspects described in the embodiments below may be used alone or in any combination, and are not limited to the combinations explicitly described herein.

FIG. 1 is a block diagram of a quantum mechanical system, according to some embodiments. System 100 includes a physical qubit 110 and a quantum mechanical oscillator 120. In the example of FIG. 1, the qubit and the oscillator are dispersively coupled—that is, the qubit-oscillator detuning is much larger (e.g., an order of magnitude larger) than the coupling strength between the qubit and the oscillator. An electromagnetic signal $\Omega(t)$ is applied to the physical qubit 110 and an electromagnetic signal $\epsilon(t)$ is applied to the quantum mechanical oscillator 120. Generally in the discussion below, application of such an electromagnetic signal or pulse may also be referred to as "driving" of the qubit or oscillator.

In the example of FIG. 1, the state of the oscillator 120 may be represented by a superposition of components, each component comprising an excitation number eigenstate (also known as a Fock state), $|n\rangle$, and a corresponding probability amplitude, $c_n$:

$$|\psi\rangle_{OSC.} = \sum_{n=0}^{\infty} c_n |n\rangle. \quad \text{(Eqn. 1)}$$

According to some embodiments, the quantum mechanical oscillator 120 may comprise a resonator cavity, such as a microwave cavity. In such embodiments, the system 100 may be described using the Hamiltonian:

$$H/\hbar = \omega_c \hat{a}^\dagger \hat{a} + \omega_q |e\rangle\langle e| + \chi \hat{a}^\dagger \hat{a} |e\rangle\langle e|, \quad \text{(Eqn. 2)}$$

where higher order terms are omitted.

In Eqn. 2, $\omega_q$ is the qubit transition frequency between the ground state $|g\rangle$ and the excited state $|e\rangle$ of the qubit; $\omega_c$ s the resonant frequency of the cavity; $\chi$ is the dispersive coupling constant between the qubit and the oscillator; $\hat{a}^\dagger$ and $\hat{a}$ are the creation and annihilation operators, respectively, for a photon in the cavity. As a result of the dispersive coupling, when a photon is added to the cavity the qubit transition frequency changes by $\chi$. The SNAP gate may thereby modify a particular Fock state $|n\rangle$ of the oscillator by driving the qubit (i.e., by applying an electromagnetic impulse to the qubit) at a frequency $\omega_q + n\chi$. According to some embodiments, such a SNAP gate may modify the Fock state $|n\rangle$ by altering the phase of the state.

According to some embodiments, multiple SNAP gates may be applied to multiple Fock states using an electromagnetic pulse that superimposes multiple SNAP gate signals. For instance, the SNAP operator may be represented as:

$$\hat{S}_n(\theta_n) = e^{i\theta_n |n\rangle\langle n|}, \quad \text{(Eqn. 3)}$$

which imparts a phase $\theta_n$ to the number state $|n\rangle$ of the oscillator whilst preserving the excitation number of the oscillator. Accordingly, multiple frequency components may be driven simultaneously, as represented by the time-dependent driving signal for the qubit:

$$\Omega(t) = \sum_n \Omega_n(t) e^{i(\omega_q - \chi n)t}, \quad \text{(Eqn. 4)}$$

Each component of the driving signal causes each excitation number state to accumulate a different phase, $\theta_n$, resulting in the generalized SNAP gate operator:

$$\hat{S}(\vec{\theta}) = \Pi_{n=0}^{\infty} \hat{S}_n(\theta_n) = \sum_{n=0}^{\infty} e^{i\theta_n} |n\rangle\langle n|, \quad \text{(Eqn. 5)}$$

where $\vec{\theta} = \{\theta_n\}_{n=0}^{\infty}$ is the list of phases associated with each excitation-number. Because each $\theta_n$ can be determined by an arbitrary function of n, the SNAP gate can simulate any arbitrary non-linear effect that conserves the excitation number of the oscillator. For example, in some embodiments, $\theta_n$ can be selected to be a function of the square of the excitation-number of the cavity to effectively induce a second order Kerr effect on the oscillator.

The displacement operator $D(\epsilon)$ may, as discussed above, provide for additional control over the Fock states of the quantum mechanical oscillator 120. While a SNAP gate may alter the phase of one or more Fock states of the oscillator, the displacement operator may adjust the Fock state populations (that is, adjust the excitation of the oscillator). According to some embodiments, the displacement operation may coherently pump or remove energy to/from the oscillator.

According to some embodiments, the displacement operator may be represented by:

$$\hat{D}(\alpha) = \exp(\alpha \hat{a}^\dagger - \alpha^* \hat{a}), \quad \text{(Eqn. 6)}$$

where the magnitude of the displacement $\alpha = i\int\epsilon(t)dt$, and where $\epsilon(t)$ is the time-dependent signal applied to oscillator.

In some embodiments, precise control of the oscillator may be obtained by placing certain constraints on the hybrid qubit-oscillator system. For example, the following three constraints may be implemented:

1) The oscillator and qubit are not driven simultaneously (i.e., $\Omega(t)\epsilon(t)=0$ for all t);
2) The qubit is in the ground state whenever the oscillator drive is on (when $\epsilon(t) \neq 0$); and
3) The qubit drive is weak relative to the dispersive coupling (i.e., $|\Omega(t)| \ll \chi$).

In some embodiments, a "weak" coupling between the physical qubit and the oscillator may mean that the qubit drive is at least one order of magnitude less than the dispersive coupling.

At least under these constraints, the inventors have recognized and appreciated that universal control of the states of the oscillator may be achieved by suitable applications of the two operations of SNAP gates and displacements as described above.

To show that the operators $\hat{D}(\alpha)$ and $\hat{S}(\vec{\theta})$ are sufficient for universal control of the quantum state of the oscillator, $\hat{p} = -i(\hat{a}^\dagger - \hat{a})$ is identified as the generator of $\hat{D}(\alpha)$ for real $\alpha$, and $$\left\{\hat{Q}_n = \sum_{n'=0}^{n} |n'\rangle\langle n'|\right\}_n$$

is identified as the generators of $\hat{S}(\vec{\theta})$. The commutator of these two generators is:

$$\hat{J}_n = i[\hat{p}, \hat{Q}_n] = \sqrt{n+1}(|n\rangle\langle n+1| + |n+1\rangle\langle n|), \quad \text{(Eqn. 7)}$$

which is capable of selectively coupling the excitation numbers $|n\rangle$ and $|n+1\rangle$. The commutator $\hat{J}_n$ can be identified as the generator for the SO(2) rotation group:

$$\hat{D}(\epsilon)\hat{R}_n(\epsilon)\hat{D}(-\epsilon)\hat{R}_n(-\epsilon) = \exp(iJ_n\epsilon^2 + O(\epsilon^3)), \quad \text{(Eqn. 8)}$$

for small $\epsilon$. For any integer $N>0$, $\{\hat{J}_m\}_{m=1}^{N}$ and $\{\hat{Q}_m\}_{m=1}^{N}$ are sufficient to generate the Lie algebra u(N) over a truncated number space spanned by $\{|n\rangle | n<N\}$, which implies universal control of the oscillator.

In some embodiments, it may be desirable to avoid the Kerr effect when manipulating the state of the oscillator. The Kerr effect creates a photon-number dependent phase evolution and results in "spreading" of coherent states of the oscillator. In some embodiments, the SNAP gate may be used to cancel the phase that results from the Ken effect. In some embodiments, a SNAP gate may be periodically applied to cancel the quantum state evolution from the Kerr effect. For example, a SNAP gate may be applied once every microsecond using a pulse consisting of superposed sideband-modulated Gaussians.

According to some embodiments, the physical qubit 110 may include a Josephson junction, though may in general be any non-linear two-level quantum system including trapped ion qubits and/or Rydberg atoms. According to some embodiments, physical qubit 110 may include a transmission line shunted plasma oscillation ("transmon") qubit. According to some embodiments, quantum mechanical oscillator 120 may include a radiation cavity, such as a microwave cavity. Such a cavity may be a stripline cavity or a three-dimensional cavity.

As illustrative yet non-limiting examples, the qubit may have a transition frequency $\omega_g$ between 5 GHz and 10 GHz, such as between 7 GHZ and 8 GHZ, or approximately 7.6 GHz; the quantum mechanical oscillator may have a transition frequency $\omega_c$ between 6 GHz and 11 GHz, such as between 8 GHz and 9 GHz, or approximately 8.2 GHz; the dispersive shift $\chi$ may be between 1 MHz and 10 MHz, such as between 4 MHz and 9 MHz, or such as approximately 8.2 MHz.

FIGS. 2-6 illustrate various aspects of the universal control outlined above, each of which may in some embodiments utilize the system of FIG. 1 to perform universal control of an oscillator. It will be appreciated that FIGS. 2-6 are provided merely as illustrative examples and that techniques of universal control are not limited to these particular examples.

Figure 2:
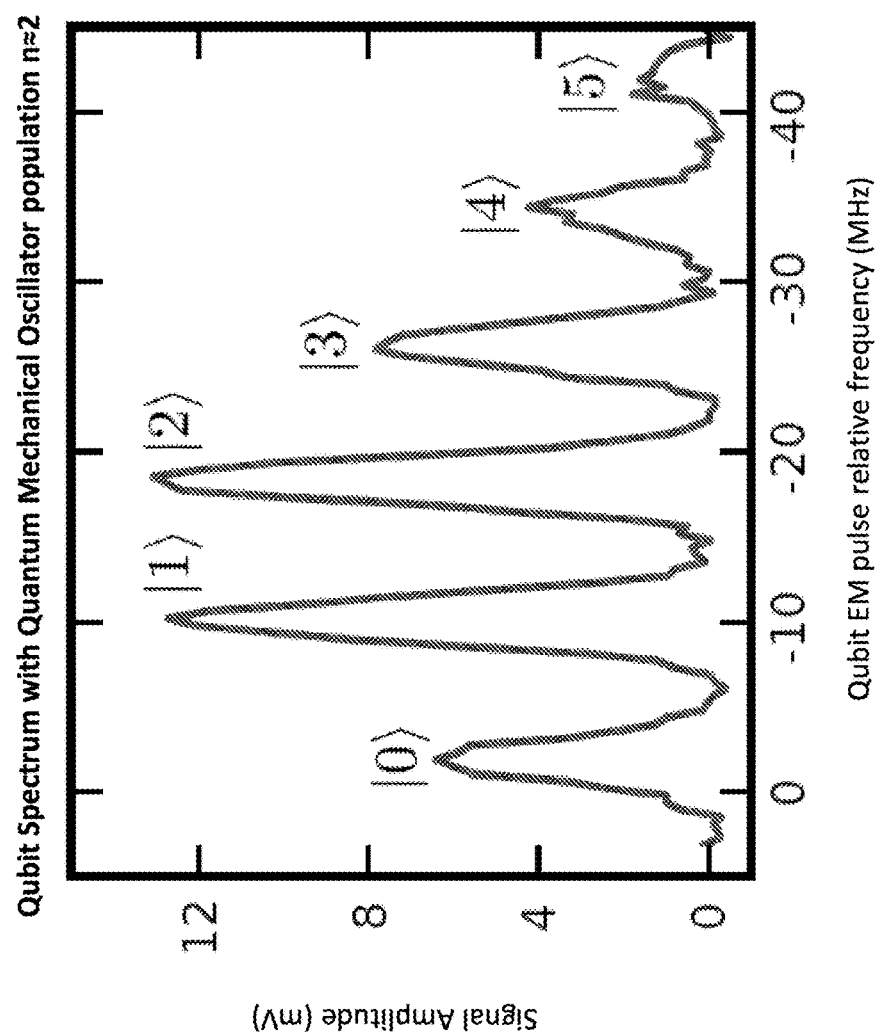
FIG. 2 depicts an illustrative spectrum of a qubit coupled to a quantum mechanical oscillator, according to some embodiments.

FIG. 2 depicts an illustrative spectrum of a qubit coupled to a quantum mechanical oscillator, according to some embodiments. As discussed above, dispersive coupling between a physical qubit and a quantum mechanical oscillator causes the number states of the oscillator |n> to resolve to different frequencies of the qubit. This configuration is sometimes referred to the "number-split regime."

FIG. 2 is an example of a qubit spectrum for a qubit dispersively coupled to an resonant cavity which has a population $\bar{n} \approx 2$. The horizontal axis of the figure represents the shift in the qubit transition frequency for excitations of different Fock states of the coupled resonant cavity. Put another way, the figure illustrates that the qubit transition frequency depends on the number of photons in the cavity.

In the example of FIG. 2, the different Fock states of the oscillator |0>, |1>, |2, |3>, |4> and |5> are each associated with particular different transition frequencies of the qubit. For example, the transition frequency of the qubit where there are no photons in the cavity is defined as 0 MHz of detuning (and equal to the ostensible qubit transition frequency, which as discussed above may in some embodiments be between 5 GHz and 10 GHz). When the cavity includes a single photon, the transition frequency of the qubit is detuned by approximately 10 MHz; when the cavity includes two photons, the transition frequency of the qubit is detuned by approximately 17 MHz; when the cavity includes three photons, the transition frequency of the qubit is detuned by approximately 26 MHz; when the cavity includes four photons, the transition frequency of the qubit is detuned by approximately 34 MHz; and when the cavity includes five photons, the transition frequency of the qubit is detuned by approximately 43 MHz. This number-dependent detuning of the transition frequency can be approximated as an $n\chi 0$ detuning, where n is the excitation number of the cavity and $\chi$ is a detuning per photon number. For example, $\chi$ may be approximately 8.3 MHz.

Based on this number-dependent detuning of the transition frequency of the qubit, the qubit may be addressed selectively using driving pulses with narrow spectral widths and central frequencies tuned to match the detuned transition frequencies for a particular excitation number. For example, driving the qubit at a frequency with 10 MHz detuning will cause the quantum state of the cavity to change only if there is a single photon in the cavity. Thus, a SNAP gate may be applied to adjust the quantum phase of a particular Fock state of an oscillator by selecting the appropriate frequency to match the targeted state. As discussed above, a SNAP gate may also include multiple pulses each targeting different Fock states within the same signal; since each pulse may be of a different frequency, pulses may be combined into a single signal.

Figure 3:
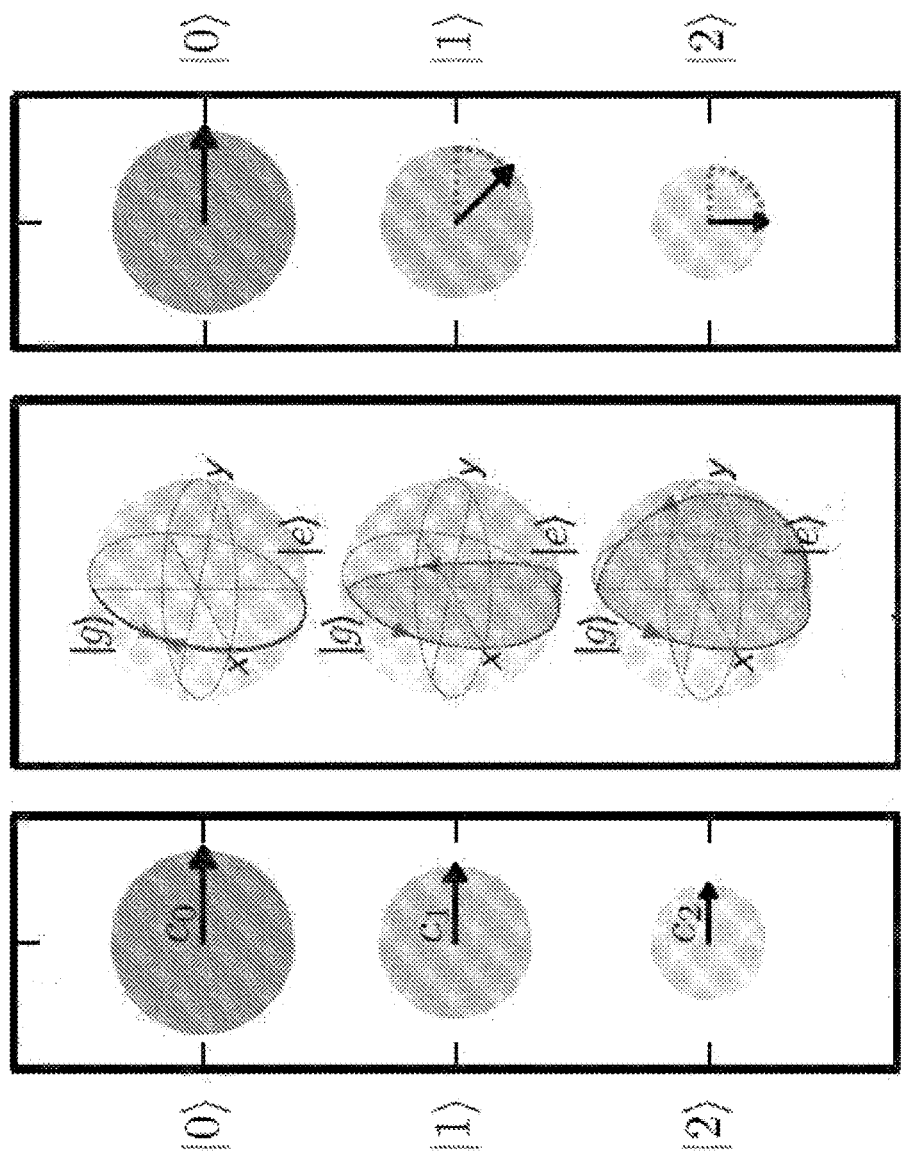
FIG. 3 depicts an illustrative process of manipulating states of a quantum mechanical oscillator, according to some embodiments.

FIG. 3 depicts an illustrative process of manipulating states of a quantum mechanical oscillator, according to some embodiments. In chart 300, a SNAP gate that includes two pulses targeting the |1> and |2> Fock states of the oscillator is applied to a qubit dispersively coupled to the oscillator. The area of each circle in the initial states represents the probability that a measurement of the oscillator would produce the associated measurement. For instance, a measurement of the oscillator would be more likely to measure the |0> state than the |1> state or the |2> state.

FIG. 3 is provided to illustrate the concept that two rotations performed upon the qubit that enclose a solid angle in the qubit's Bloch sphere will impart a geometric phase to the coupled oscillator equal to the subtended angle. In the example of FIG. 3, two rotations are performed on the qubit by driving the qubit in a particular way. In this example, two pi-pulses (pulses causing a rotation of $\pi$ radians around the Bloch sphere) are used to cause the state of the qubit to follow a trajectory on the Bloch sphere associated with each excitation number of the cavity. For example, the trajectory 310 follows a first path on the Bloch sphere from |g> to |e> and then follows the same path on the Bloch sphere back from |e> to |g>. Consequently, no solid angle is subtended by the trajectory 110 and no geometric phase is introduced to the |0> component of the oscillator.

In contrast, the trajectory 311 follows a first path on the Bloch sphere from |g> to |e> and the follows a second path on the Bloch sphere back from |e> to |g>. Consequently, the trajectory 311 subtends a first solid angle and, therefore, introduces a first geometric phase to the |1> component of the oscillator. The trajectory 312 follows a first path on the Bloch sphere from |g> to |e> and then follows a second path on the Bloch sphere back from |e> to |g>. Consequently, the trajectory 112 subtends a second solid angle and, therefore, introduces a second geometric phase to the |2> component of the oscillator. In some embodiments, the first solid angle is different from the second solid angle resulting in different geometric phases being introduced to each component of the oscillator. As shown, the solid angle subtended by trajectory 312 is greater than that of trajectory 311, and accordingly the phase imparted to the associated state of the oscillator is greater in the former case than in the latter.

In some embodiments, the first path of the trajectory the Bloch sphere and the second path of the trajectory on the Bloch sphere is generated using a pi-pulse. The exact path taken by the quantum state of the qubit may be dependent on the axis that the pi-pulse is applied. In this way, the first path and the second path can be made different, thereby causing the trajectory to subtend a solid angle on the Bloch sphere. Consequently, a geometric phase may be introduced into the quantum state of the qubit-oscillator system.

In some embodiments, the quantum state of the qubit during a SNAP gate begins and ends at the ground state, as illustrated by the trajectories 310-312. This type of trajectory may reduce the effects of relaxation and dephasing times on the quantum state of the oscillator before and/or after the SNAP gate is performed.

The right-most box of FIG. 3 illustrates the final state of each phasor after the introduction of the respective geometric phase. The phasor 320 associated with n=0 undergoes no phase shift since no solid angle was subtended by the quantum state of the qubit. The phasor 321 associated with n=1 acquires a first phase shift, illustrated by the dashed line. The phasor 322 associated with n=2 acquires a second phase shift, illustrated by the dashed line. In some embodiments, the second phase shift is different from the first phase shift, e.g., the second phase shift is larger or smaller than the first phase shift. These imparted phase shifts may be represented as: $|g, n\rangle \rightarrow e^{i\theta_n}|g, n\rangle$, where $\theta_n$ is the phase shift imparted on the component of the quantum state associated with the excitation number n of the oscillator.

Figure 4A:
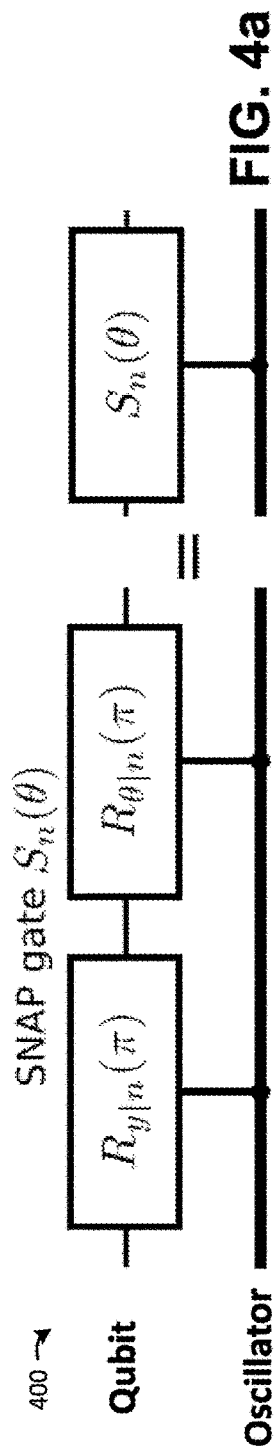
FIGS. 4A-4C depict illustrative quantum gates that may be applied to a qubit, according to some embodiments.
Figure 4B:
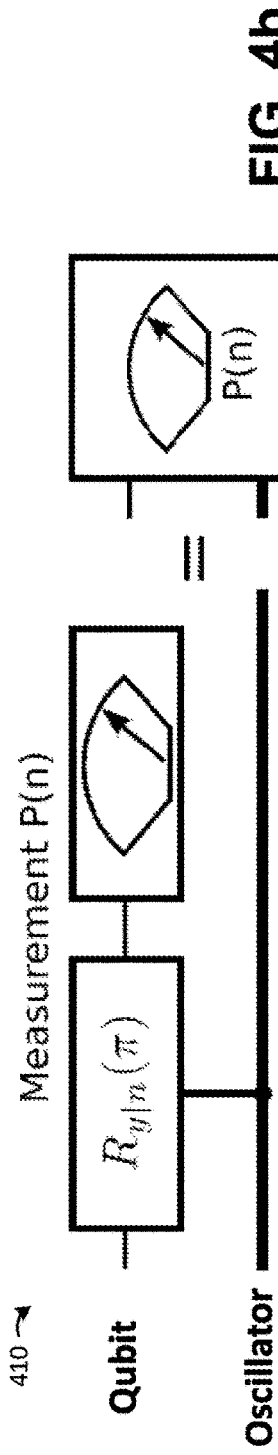
Figure 4C:
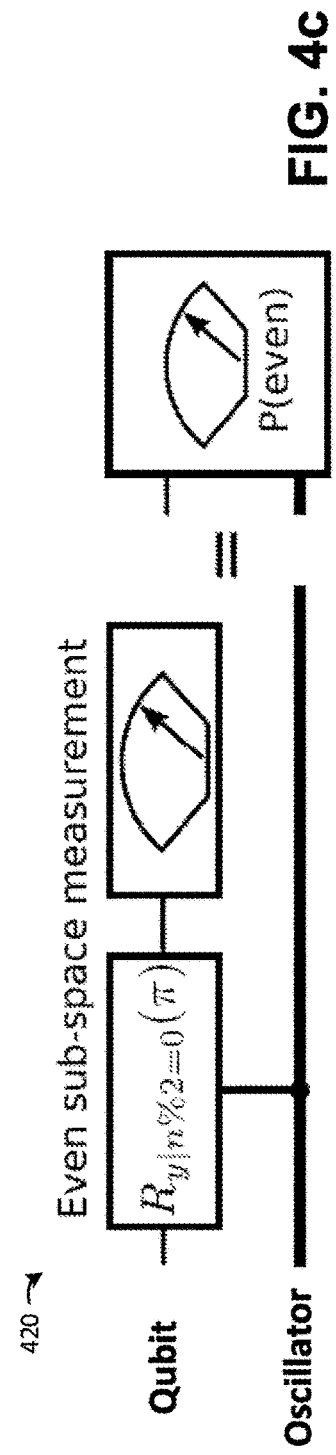

FIGS. 4A-4C depict illustrative quantum gates that may be applied to a qubit, according to some embodiments. In the example of FIG. 4A, a SNAP gate comprising two pi-pulses is applied to a qubit. This might be, for example, the illustrative SNAP gate shown in FIG. 3 and discussed above, though could also be any other suitable SNAP gate. In FIGS. 4A-4C, the notation $R_{y|n}(\phi)$ should be read as "a rotation by angle $\phi$ around y conditional on there being n photons in the oscillator." The illustrative SNAP gate shown in FIG. 4A therefore applies two rotations of angle $\pi$ around two different axes of the qubit's Bloch sphere in a manner dependent on there being n photons in the oscillator (e.g., both pulses could have a frequency targeting the particular oscillator state as discussed above in relation to FIG. 2).

FIG. 4B illustrates an example of using a SNAP gate to measure the population of the oscillator. In some embodiments, driving the qubit to shift the quantum state from the ground state to the excited state in an excitation-number-dependent manner may be used as a measurement technique for the cavity. For example, by applying a pi-pulse at the detuned transition frequency associated with n=3 will cause the qubit to transition from the ground state to the excited state if there are three photons present in the cavity. Then, by performing a conventional readout of the state of the qubit, it may be determined whether there were three photons in the cavity. FIG. 4B depicts such a process wherein a SNAP gate is applied to the qubit and the qubit's state is then measured, without there being an intermediate step in which the qubit is driven to the ground state. This provides an estimate of the population of state n of the oscillator, wherein the SNAP gate was applied based on state n (e.g., with a frequency based on the qubit spectrum for that state).

FIG. 4C illustrates an example of using a SNAP gate to measure the parity of the oscillator. According to some embodiments, by selectively applying pulses to the qubit that target Fock states with even (odd) number states then by performing a standard measurement of the qubit, an estimate of whether the parity of the oscillator is even (odd) may be determined.

Figure 5:
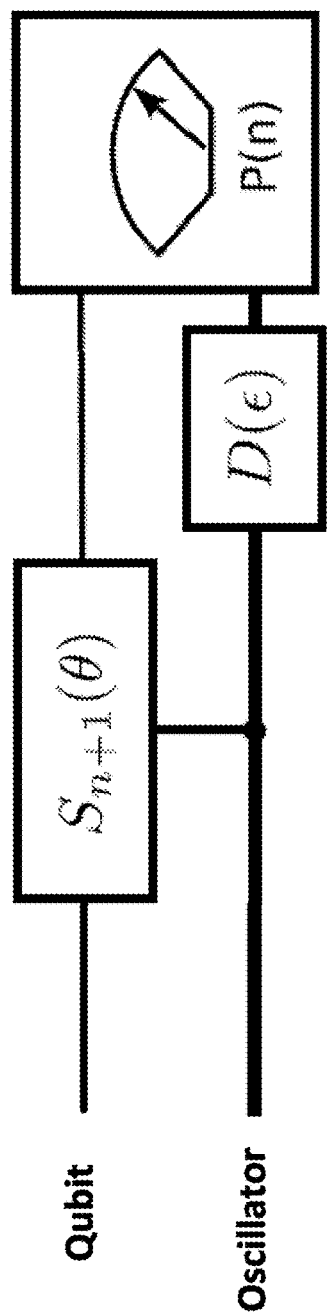
FIG. 5 depicts a combination of a Selective Number-Dependent Arbitrary Phase (SNAP) gate and a displacement operation applied to a qubit and a quantum mechanical oscillator, respectively, according to some embodiments.

FIG. 5 depicts a combination of a Selective Number-Dependent Arbitrary Phase (SNAP) gate and a displacement operation applied to a qubit and a quantum mechanical oscillator, respectively, according to some embodiments. As discussed above, the combination of a SNAP gate, which affects the quantum phase of one or more Fock states of an oscillator, with a displacement operator, which affects the Fock state populations of an oscillator, may, according to some embodiments, produce any arbitrary unitary operation upon the oscillator, yielding universal control of the oscillator. FIG. 5 illustrates the combination of a SNAP gate and a displacement operator to measure the phase difference between Fock states as a function of time.

In the example of FIG. 5, the phase measurement is performed by, first, applying a variable phase $\theta$ using the SNAP gate $\hat{S}_{n+1}(\theta)$ 501. The SNAP gate adds a phase shift $\theta$ to the probability amplitude $c_n$ associated with the state $|n\rangle$. Then, a small displacement operator $\hat{D}(\epsilon)$ 502 is applied to the oscillator. By applying the SNAP gate prior to the displacement operator, a phase that causes the $c_n$ and $c_{n+1}$ phasors to be parallel with one another may be determined. In this way, the phase shift between the two components may be determined. Finally, the population of the state $|n\rangle$ is measured (step 503) to determine p(n).

Figure 6:
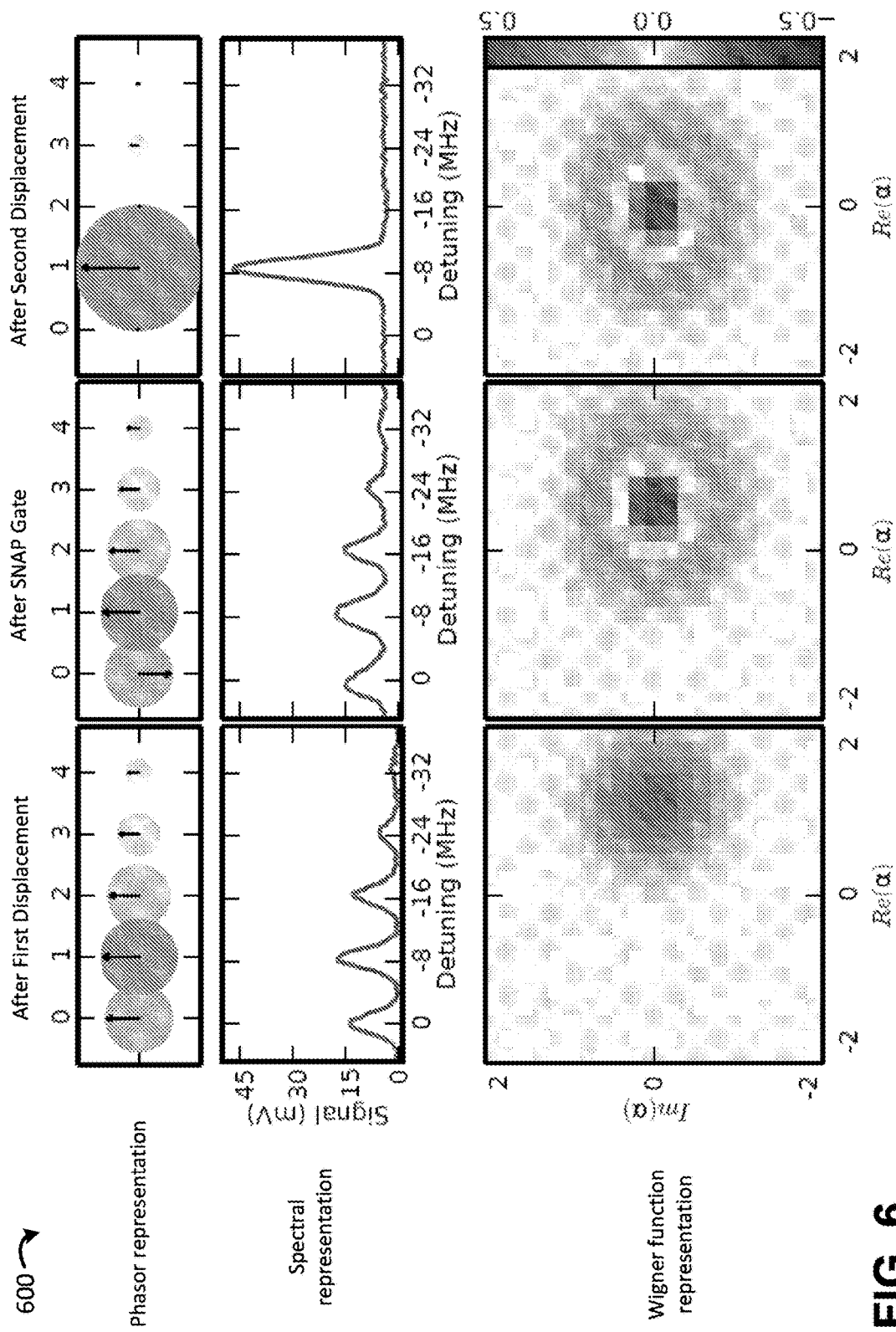
FIG. 6 depicts an illustrative sequence of state manipulation producing a Fock state $|1\rangle$ within a quantum mechanical oscillator, according to some embodiments.

FIG. 6 depicts an illustrative sequence of state manipulation producing a Fock state $|1\rangle$ within a quantum mechanical oscillator, according to some embodiments. Using the above-described techniques of quantum state preparation, it is possible to generate Fock states in an oscillator using a combination of SNAP gates and displacement operations. By way of example, FIG. 6 illustrates the creation of the Fock state $|1\rangle$ by applying the composite operator comprising a first displacement operation with a magnitude $\beta_1$, a SNAP gate, then a second displacement operation with a magnitude $\beta_2$, the combined gate being $\hat{D}(\beta_2)\hat{S}(\vec{\theta})\hat{D}(\beta_1)$. In this example, the displacement amounts were numerically optimized while $\vec{\theta}$ was fixed to be $(\pi, 0, 0, \ldots)$.

FIG. 6 illustrates the state of the cavity in three different ways. First, across the top row is a phasor representation of the quantum state of the oscillator for excitation numbers n=0, 1, 2, 3 and 4. The arrow represents the phase associated with each component and the area of the circle is proportional to the probability of n photons being detected in the associated state of the oscillator. Second, across the middle row is a spectral representation of the quantum state of the oscillator based on the photon number dependent resonant frequency of the qubit coupled to the oscillator. Third, across the bottom row is a Wigner function representation of the quantum state.

The state of the oscillator after the first displacement operation is illustrated in the first column of FIG. 6. Because the state of the cavity is initially the vacuum state, the displacement by $\beta_1$ (which in this example is approximately equal to 1.14) populates the cavity with a coherent state. The state of the oscillator after the SNAP gate is illustrated in the second column of FIG. 6. The SNAP gate applies a pi-phase shift to the $|0\rangle$ component and also performs Kerr-correction on the Kerr induced phases of the other components. The resulting quantum state is a displaced Fock state. Accordingly, to transform the displaced Fock state into an actual Fock state, it should be displaced back towards the origin. The state of the oscillator after the second displacement operation is illustrated in the third column of FIG. 6. The displacement by $\beta_2$ (which in this example is approximately equal to $-0.58$) displaces the state back towards the origin resulting in the Fock state $|1\rangle$. Experimentally, fidelities of 0.90 have been recorded in such a sequence, while simulation results show that the pulse sequence applied can result in fidelities up to 0.98.

In some embodiments, the three-stage displacement-phase-displacement scheme can be extended to construct operators that climb the ladder of Fock states by successive application of the three-stage scheme. In some embodiments, this may result in two displacement operators being applied one after the other. In such a situation, the two displacement operations can be collapsed into a single displacement operation, thereby reducing the number of quantum gates applied to the system to create a target quantum state.

Figure 7:
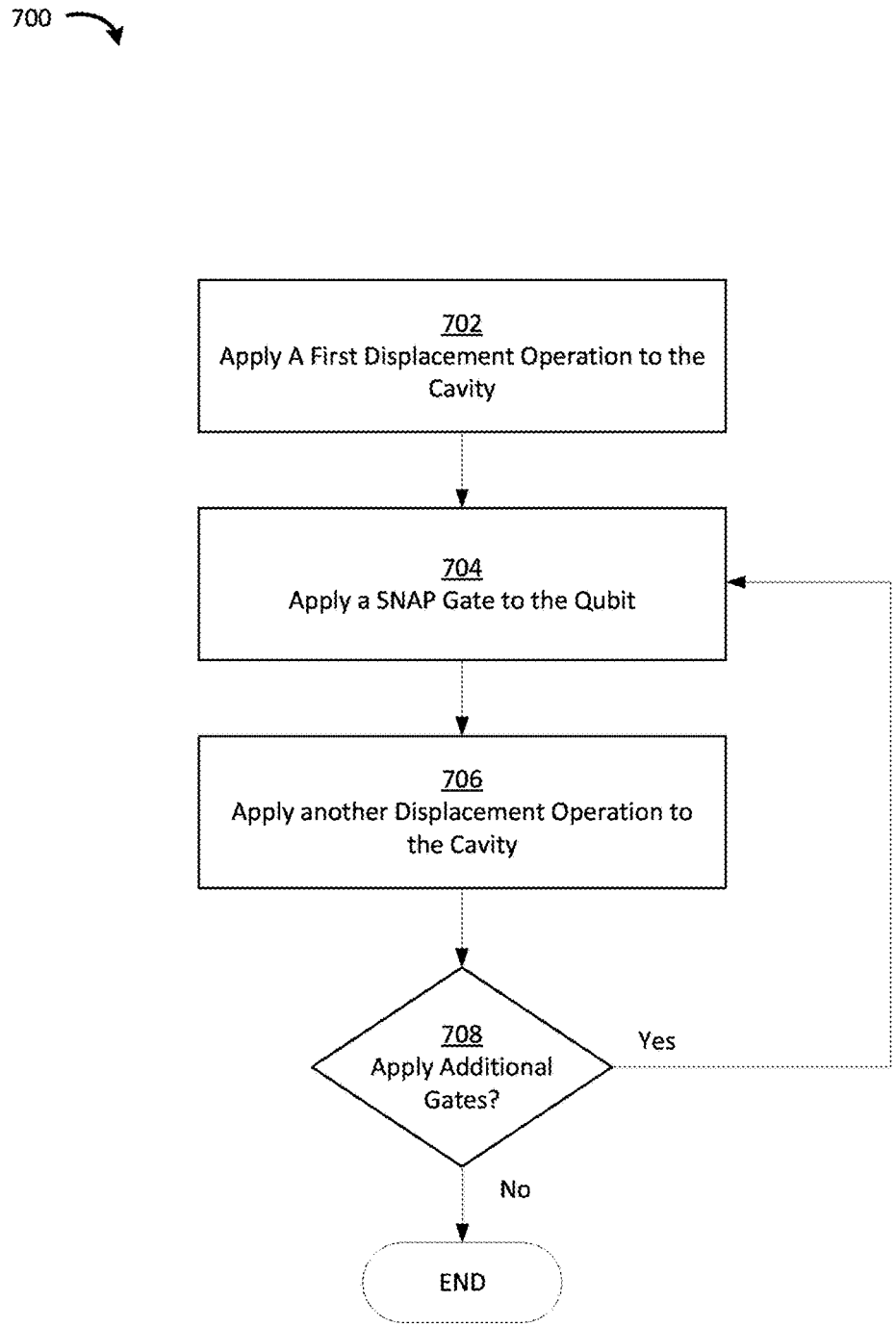
FIG. 7 depicts a method of applying SNAP gate(s) and one or more displacement operations to a quantum mechanical system, according to some embodiments.

FIG. 7 depicts a method of applying SNAP gate(s) and one or more displacement operations to a quantum mechanical system, according to some embodiments. Method 700 may be applied, for example to system 100 shown in FIG. 1 and discussed above, though may also be applied to any suitable quantum system in which a qubit is off-resonantly or dispersively coupled to a quantum mechanical oscillator.

Method 700 begins in act 702 in which a first displacement operation is applied to the oscillator. This may be performed by, for example, introducing radiation to the oscillator (e.g., microwave radiation) with a resonant frequency of the oscillator.

At act 704, a SNAP gate is applied. As discussed above, this may be achieved by controlling the qubit, which is coupled to the oscillator, such that a number-dependent phase is imparted on the quantum state of the oscillator. In some embodiments, the phase may be a geometric phase imparted by causing the quantum state of the qubit to traverse a trajectory on a Bloch sphere that subtends a solid angle. For example, a series of microwave pulses may be used to cause the state of the qubit to move along a path on the Bloch sphere. In some embodiments, a first pi-pulse applied along a first axis would cause the qubit state to move from the north pole of the Bloch sphere to the south pole of the Bloch sphere along a first geodesic path. A second pi-pulse applied after the first pi-pulse would cause the qubit state to move back to the north pole of the Bloch sphere from the south pole of the Bloch sphere along a second geodesic path. The location of the first and second path on the Bloch is dependent on the axis along which the pi-pulses are applied.

In act 706, another displacement operation is applied to the oscillator. In some cases, the displacement operation (e.g., its amplitude) may be selected based on the SNAP gate applied in act 704. In act 708, is it determined whether additional gates will be applied and either method 700 ends or returns to act 704 to apply another SNAP gate.

As discussed above, in some cases multiple displacement operations and/or SNAP gates may be performed one after another, and so the particular sequence of method 700 may not represent all possible sequences of operations utilizing the techniques for universal control discussed herein.

Figure 8:
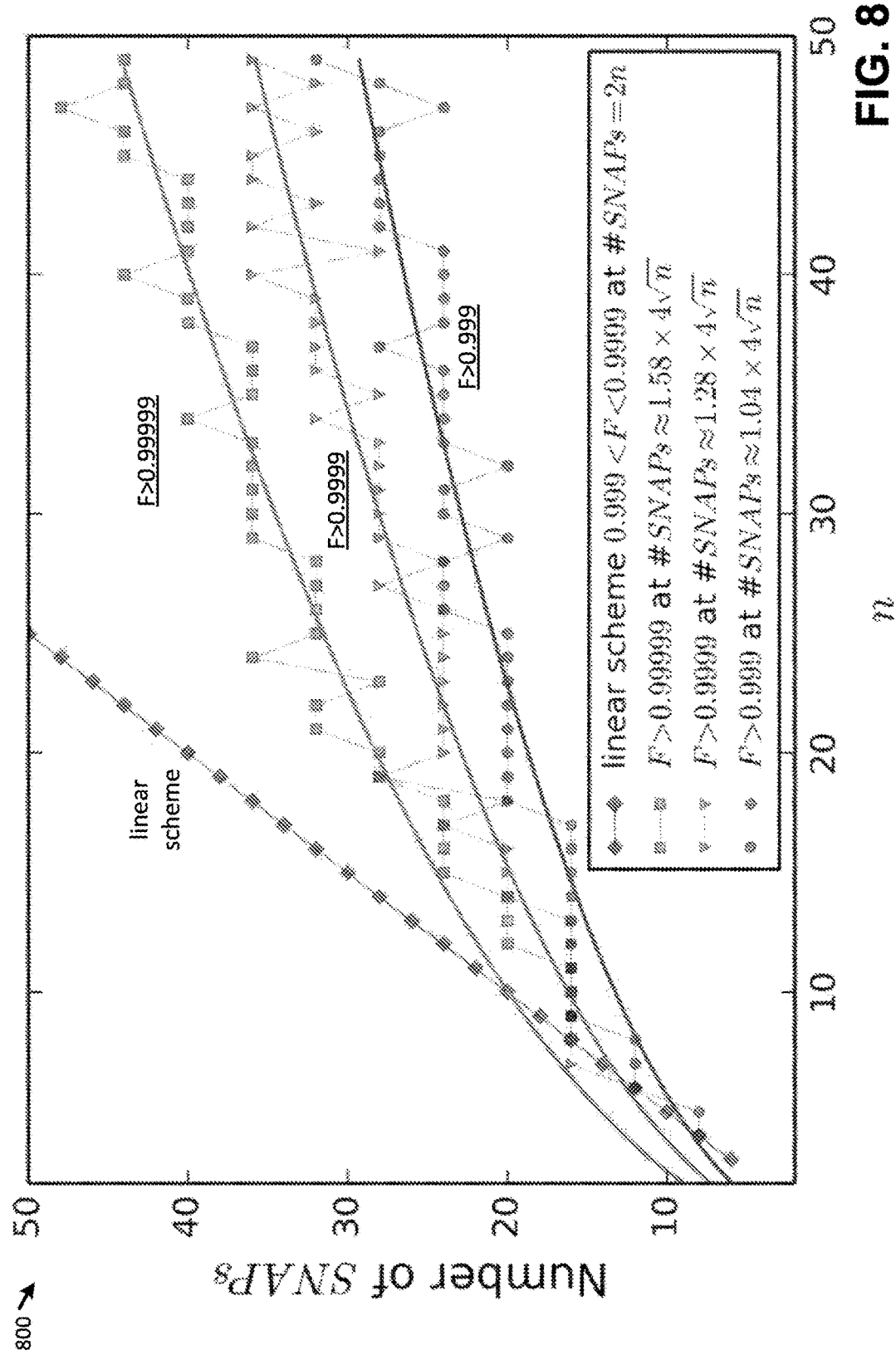
FIG. 8 illustrates the number of SNAP gates that may be applied to produce a particular Fock state $|n\rangle$, according to some embodiments.

FIG. 8 illustrates the number of SNAP gates that may be applied to produce a particular Fock state |n>, according to some embodiments. As discussed above, the SNAP operator and displacement operator can be used for universal control of the state of an oscillator. In some embodiments, to construct an arbitrary target quantum state, a control sequence with a finite number of steps to prepare the target quantum state may be determined. An arbitrary quantum state of the oscillator is defined by the probability amplitudes $c_n$ shown in Eqn. 1.

First, the state in Eqn. 1 may be re-written using the SNAP operator as:

$$|\psi\rangle_{OSC.} = \Sigma_{n=0}^n c_n |n\rangle = \tilde{S}|\tilde{\psi}\rangle, \qquad \text{(Eqn. 9)}$$

where $\tilde{S} = \hat{S}(\{\arg(c_n)\})$ is the SNAP gate and $|\tilde{\psi}\rangle = \Sigma_{n=0}^N |c_n| |n\rangle$. Accordingly, if the state $|\tilde{\psi}\rangle$, with only non-negative amplitudes in the excitation-number basis, can be constructed, then the state $|\psi\rangle_{HO}$ can be constructed with the additional use of a SNAP gate.

Next, the amplitude can be "unrolled" via a sequence of intermediate states $$\{|\Psi_n\rangle\}_{n=0}^N,$$

with $$|\Psi_n\rangle = \left(\sum_{n'=0}^{n-1} \tilde{c}_{n'} |n'\rangle\right) + \tilde{d}_n |n\rangle$$

and $$\tilde{d}_n = \sqrt{\sum_{n'=n}^N \tilde{c}_{n'}^2},$$

which connects the initial state $|\tilde{\psi}_0\rangle = |0\rangle$ and the target state $|\tilde{\psi}_N\rangle = |\tilde{\psi}\rangle$. A rotation $\hat{U}_n \in SO(2)$ that acts non-trivially in the subspace spanned by $\{|n\rangle, |n+1\rangle\}$, results in $\hat{U}_n \tilde{d}_n |n\rangle = \tilde{c}_n |n\rangle + \tilde{d}_{n+1} |n+1\rangle$ and consequently $\hat{U}_n |\tilde{\psi}_n\rangle \approx |\tilde{\psi}_{n+1}\rangle$ for n=0,1,..., N.

Accordingly, in some embodiments, to transfer photon population from $|\psi_{init}\rangle = |n\rangle$ to $|\psi_{final}\rangle = |n+1\rangle$, with an efficient implementation, the following composite operator may be used:

$$\hat{U}_n = \hat{D}(\alpha_1^{(n)}) \hat{R}_n(\pi) \hat{D}(\alpha_2^{(n)}) \hat{R}_n(\pi) \hat{D}(\alpha_3^{(n)}), \qquad \text{(Eqn. 10)}$$

where $$\hat{R}_n(\pi) = -\sum_{n'=0}^n |n'\rangle\langle n'| + \sum_{n'=n+1}^\infty |n'\rangle\langle n'|$$

is a SNAP gate with π phase shift for number states with no more than n excitations. To maximize the state preparation fidelity, $F = |\langle \psi_{final}|\hat{U}_n|\psi_{init}\rangle|$, the displacements $(\alpha_1, \alpha_2, \alpha_3)$ may be selectively or arbitrarily chosen. Moreover, $\hat{U}_n$ can be optimized for coherently transfer from $|\psi_{init}\rangle = |n\rangle$ to $|\psi_{final}\rangle = \sin(\theta)|n+1\rangle + \cos(\theta)|n\rangle$ for $$\theta \in \left[0, \frac{\pi}{2}\right]$$

with fidelity better than 0.999. For the purposes of this application, the construction of a final quantum state with a fidelity greater than 0.95 is considered a successful construction of the desired target state.

Using these building blocks, a sequence of operators $\hat{U}_n \in SO(2)$ can be constructed that act on the subspaces $\{|n\rangle, |n+1\rangle\}$ so that $\hat{U}_n|n\rangle = \cos\theta_n|n\rangle + \sin\theta_n|n+1\rangle$ with $$\sin\theta_n = \frac{d_{n+1}}{d_n}.$$

The product $\hat{U}_{N-1} \ldots \hat{U}_1\hat{U}_0$ provides an initial guess for state preparation. The displacement $\hat{D}(\alpha_1^{(n)})$ from $\hat{U}_n$ is then combined with the displacement $\hat{D}(\alpha_3^{(n+1)})$ from $\hat{U}_{n+1}$ to reduce the number of parameters. Finally, optimization over all 2N+1 displacement parameters with an initial guess based on the result from the previous "local" optimizations is performed. Performing the complete procedure requires N optimizations over 3 parameters and one optimization over 2N+1 parameters.

The above scheme of employing SO(2) rotations to prepare arbitrary states of the oscillator applies generally to any state and scales linearly with the highest excitation number in the state. However, certain states with a narrow distribution of excitation numbers, such as an excitation number state |n>, can be prepared more efficiently by using the displacement operator. By way of comparison, using the general technique to prepare the excitation number state |n> requires state O(n) sequential SO(2) rotations from the state |0>, whereas if the state |0> is first displaced by the displacement operator to the state $\hat{D}(\alpha)|0\rangle=|\alpha\rangle$, where state $\alpha=\sqrt{n}$, which results in a coherent state centered on |n> with a spread $O(\sqrt{n})$, only $O(\sqrt{n})$ SO(2) rotations are required to transform the coherent state |α> into the number state |n>. Accordingly, using a displacement operator first creates a "sublinear" state preparation scheme. This sublinear scheme operates on the coherent state by "folding" the photon populations from the photon number states surrounding |n> (e.g., |n−Δn> . . . |n+Δ>) to the excitation number state |n>. With large Δn being folded into |n>, higher fidelity may be achieved, but at the expense of requiring more SNAP gates.

FIG. 8 compares the number of SNAP gates needed between the generic linear scheme (with O(n) operations) and the specialized sublinear schemes (with $O(\sqrt{n})$ operations) designed for preparation from |0> to |n>, with various target fidelities. The number of SNAP gates for the preparation from |0> to |n> (with fixed lower bound of fidelity) for the linear scheme (diamond line) and specialized sublinear schemes with different target fidelities: F>0.999 (circle line), F>0.9999 (triangle line), and F>0.99999 (square line). FIG. 8 illustrates that it becomes advantageous to use the specialized sublinear scheme instead of the generic scheme for n≥8.

Figure 9:
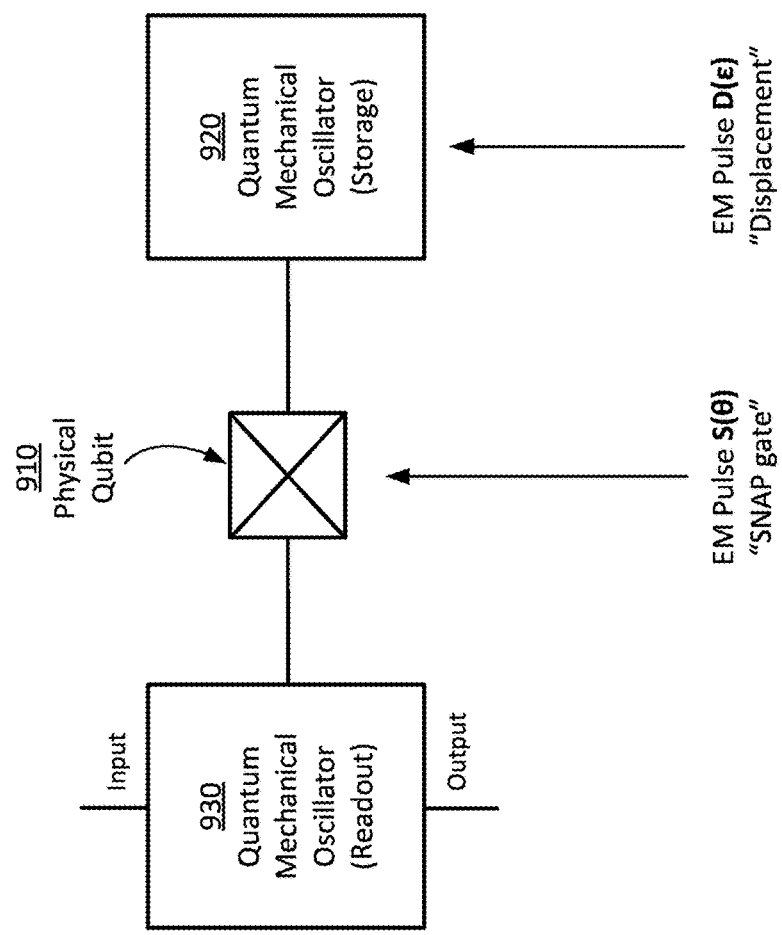
FIG. 9 is a block diagram of a quantum mechanical system including multiple quantum mechanical oscillators, according to some embodiments.

FIG. 9 is a block diagram of a quantum mechanical system including multiple quantum mechanical oscillators, according to some embodiments. In system 900, physical qubit 910 and oscillator 920 may be operated as qubit 110 and oscillator 120 described above in relation to FIG. 1. In addition, a second quantum mechanical oscillator 930 may be supplied coupled to the qubit 910. In operation, oscillator 930 may be operated as a fast "readout" oscillator whereas oscillator 920 may be operated as a "storage" oscillator. The differences in function may correspond to their decoherence times; the readout oscillator may have a shorter decoherence time (and a lower quality factor) than the storage oscillator. When the state of the system is read by an outside observer or device, the readout oscillator may be accessed so that the state of the storage oscillator remains undisturbed by the measurement.

Having thus described several aspects of at least one embodiment of this invention, it is to be appreciated that various alterations, modifications, and improvements will readily occur to those skilled in the art.

Such alterations, modifications, and improvements are intended to be part of this disclosure, and are intended to be within the spirit and scope of the invention. Further, though advantages of the present invention are indicated, it should be appreciated that not every embodiment of the technology described herein will include every described advantage. Some embodiments may not implement any features described as advantageous herein and in some instances one or more of the described features may be implemented to achieve further embodiments. Accordingly, the foregoing description and drawings are by way of example only.

Various aspects of the present invention may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Also, the invention may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

What is claimed is:

1. A method of operating a circuit quantum electrodynamics system that includes a physical qubit dispersively coupled to a quantum mechanical oscillator, the method comprising:
   applying a first electromagnetic pulse to the physical qubit based on a number state of the quantum mechanical oscillator, wherein the first electromagnetic pulse causes a change in state of the quantum mechanical oscillator; and
   applying, subsequent to application of the first electromagnetic pulse, a second electromagnetic pulse to the quantum mechanical oscillator that coherently adds or removes energy from the quantum mechanical oscillator.

2. The method of claim 1, further comprising:
   driving the physical qubit to a ground state prior to application of the first electromagnetic pulse; and
   driving the physical qubit to the ground state after application of the first electromagnetic pulse.

3. The method of claim 1, further comprising measuring a parity of the quantum mechanical oscillator by applying a third electromagnetic pulse to the physical qubit based on the number state of the quantum mechanical oscillator.

4. The method of claim 1, further comprising measuring the number state of the quantum mechanical oscillator by applying a fourth electromagnetic pulse to the physical qubit.

5. The method of claim 1, wherein a frequency of the first electromagnetic pulse is based on the number state of the quantum mechanical oscillator.

6. The method of claim 1, wherein an amplitude of the first electromagnetic pulse is less than a magnitude of a dispersive coupling between the physical qubit and the quantum mechanical oscillator.

7. The method of claim 1, wherein the change in state of the quantum mechanical oscillator caused by the first electromagnetic pulse is a quantum phase change of one or more Fock state components of the quantum mechanical oscillator.

8. The method of claim 1, wherein a qubit frequency shift per photon in the quantum mechanical oscillator is larger than a qubit transition line width.

9. The method of claim 1, wherein the first electromagnetic pulse includes a first frequency component and wherein the quantum mechanical oscillator is resonant at a second frequency, different from the first frequency.

10. The method of claim 1, wherein a frequency of the second electromagnetic pulse is a resonant frequency of the quantum mechanical oscillator.

11. The method of claim 1, wherein the second electromagnetic pulse is based at least in part on the first electromagnetic pulse.

12. The method of claim 1, wherein the physical qubit comprises a Josephson junction.

13. The method of claim 12, wherein the physical qubit is a superconducting transmon qubit.

14. The method of claim 1, wherein the quantum mechanical oscillator is a radiation cavity.

15. The method of claim 14, wherein the quantum mechanical oscillator is a microwave stripline cavity.

16. The method of claim 1, wherein the first electromagnetic pulse comprises microwave frequencies.

17. A circuit quantum electrodynamics system, comprising:
    a physical qubit;
    a quantum mechanical oscillator dispersively coupled to the physical qubit; and
    at least one electromagnetic radiation source configured to independently apply electromagnetic pulses to the qubit and to the oscillator by:
        applying a first electromagnetic pulse to the physical qubit based on a number state of the quantum mechanical oscillator to cause a change in state of the quantum mechanical oscillator; and
        applying a second electromagnetic pulse to the quantum mechanical oscillator to coherently add or remove energy from the quantum mechanical oscillator.

18. The system of claim 17, wherein:
    the quantum mechanical oscillator is a first quantum mechanical oscillator;
    the system further comprises a second quantum mechanical oscillator coupled to the physical qubit; and
    a quality factor of the second quantum mechanical oscillator is lower than a quality factor of the first quantum mechanical oscillator.

19. The system of claim 17, wherein the change in state of the quantum mechanical oscillator caused by the first electromagnetic pulse is a quantum phase change of one or more Fock state components of the quantum mechanical oscillator.

20. The system of claim 17, wherein a qubit frequency shift per photon in the quantum mechanical oscillator is larger than a qubit transition line width.

21. The system of claim 17, wherein the first electromagnetic pulse includes a first frequency component and wherein the quantum mechanical oscillator is resonant at a second frequency, different from the first frequency.

22. The system of claim 17, wherein the physical qubit comprises a Josephson junction.

23. The system of claim 22, wherein the physical qubit is a superconducting transmon qubit.

24. The system of claim 17, wherein the quantum mechanical oscillator is a radiation cavity.

25. The system of claim 24, wherein the quantum mechanical oscillator is a microwave stripline cavity.

26. The system of claim 17, wherein the first electromagnetic pulse is configured to comprise microwave frequencies.

* * * * *